(12) United States Patent
Toy

(10) Patent No.: US 6,323,419 B1
(45) Date of Patent: Nov. 27, 2001

(54) RFI SHIELDING ENCLOSURES AND THEIR CLOSURE SEALS

(76) Inventor: William W. Toy, 511 Andros La., Indian Harbour Beach, FL (US) 32937

( * ) Notice: Subject to any disclaimer, the term of this patent is extended or adjusted under 35 U.S.C. 154(b) by 0 days.

(21) Appl. No.: 09/707,154

(22) Filed: Nov. 6, 2000

(51) Int. Cl.$^7$ .................................................. H05K 9/00
(52) U.S. Cl. .................................. 174/35 GC; 361/816; 174/35 R
(58) Field of Search ............................ 174/35 R, 35 MS, 174/35 GC; 361/816, 818; 277/920

(56) References Cited

U.S. PATENT DOCUMENTS

| | | | |
|---|---|---|---|
| 3,504,093 | | 3/1970 | Roberson ................................. 174/35 |
| 4,069,618 | * | 1/1978 | Geiss ........................................ 49/483 |
| 4,677,251 | * | 6/1987 | Merewether ..................... 174/35 MS |
| 4,760,214 | * | 7/1988 | Bienia et al. ..................... 174/35 GC |
| 4,794,206 | * | 12/1988 | Weinstein ......................... 174/35 MS |
| 4,817,337 | * | 4/1989 | Lahita ...................................... 49/483 |
| 4,929,802 | * | 5/1990 | Schaepers et al. ............... 174/35 MS |
| 5,223,670 | | 6/1993 | Hogan .............................. 174/35 MS |
| 5,585,599 | | 12/1996 | Schwenk ............................ 174/35 R |

OTHER PUBLICATIONS

Catalog p. 67, Instrument Specialties, PA, No date.

* cited by examiner

*Primary Examiner*—Dean A. Reichard
*Assistant Examiner*—Hung V Ngo
(74) *Attorney, Agent, or Firm*—Alvin S. Blum

(57) ABSTRACT

An enclosure is shielded from electromagnetic radiation, especially for testing electronic equipment such as cellular telephones. An electrically conductive housing with a rectangular chamber has open top with a flange extending upward from its perimeter. An electrically conductive closure hinged to the housing has a peripheral groove holding a conductive spring finger assembly. When closed, the flange fits into the spring finger assembly, forcing the fingers apart and against the walls of the groove. This provides excellent conductive connection between the housing and the closure through the flange, the fingers, and the groove. The conductive spring finger assembly is machined from thin beryllium copper strip, formed to final shape into straight portions and corner portions with small radii and then heat treated to retain its final spring form.

17 Claims, 3 Drawing Sheets

RFI SHIELDING ENCLOSURES AND THEIR CLOSURE SEALS

BACKGROUND OF THE INVENTION

This invention relates to enclosures that are shielded from electromagnetic radiation and more particularly to such enclosures and doors that are provided with seals that achieve effective radio frequency shielding by simply closing the door.

DESCRIPTION OF THE PRIOR ART

It is common practice to place apparatus that emits electromagnetic radiation (EMR), or which is sensitive to radio frequency interference (RFI) within a shielded enclosure. When the enclosure must be frequently opened, the means for ensuring that the shielding will be restored when the opening is once again closed present problems. It is well known to provide the access door or panel with a forwardly directed blade along its perimeter that conductively engages separate sealing strips with springy contact fingers conductively held in a groove at the enclosure opening. U.S. Pat. No. 5,223,670 issued Jun. 29, 1993 to Hogan describes such an apparatus and the problems encountered. When cellular telephones are tested, they must be shielded from even the slightest stray radiation. Their emitted radiation must also be shielded when they are tested in a production facility. The closure must be repeatedly opened and closed, as each phone is tested in turn. The closure must be easy to open and close. The unit should take up little space.

LIGI TOOL AND ENGINEERING, INC. OF POMPANO BEACH, Fla. has been producing the RFI-100 Radio Interference Test Box for this purpose. It provides 80 decibel isolation up to 3 GHz. It employs a beryllium copper spring finger strip held captive in the cover that cooperates with a flange extending from the enclosure opening. The strip is series 97–542 produced by INSTRUMENT SPECIALTIES OF DELAWARE WATER GAP, Pa., U.S. Pat. No. 3,504,095. The fingers are spaced apart farther than is desirable to permit some bending of the straight strip. Because the strip cannot be bent through a radius of less than 3 inches, the overall dimensions of the apparatus are larger than is desirable. Construction needed to hold the strip in place adds to the cost. It would be desirable to have a greater degree of shielding, a smaller enclosure, and one that was less costly to produce.

SUMMARY OF THE INVENTION

It is accordingly an object of the invention to provide a means of shielding an openable closure that would enable providing smaller radii, greater shielding, less costly construction, and longer useful life without maintenance. The invention comprises a closure seal and an openable RFI shielded enclosure for testing electronic equipment. The seal of the invention comprises a generally U shaped conductive spring finger strip seated in a groove in the cover. The strip comprises a continuous web with springy fingers extending downward therefrom. The strip is comprised of eight portions, four corner portions with small radius, and four straight portions closely adjacent to one another to make an effectively continuous perimeter. The strips are formed into the final desired curved and straight shapes prior to heat treatment. A short flange extends from the housing and is designed to fit into the strip, forcing the fingers of the strip apart to press the legs against the opposed walls of the groove. This provides spring biased electrical contact between the housing, the springy fingers, and the walls of the groove.

These and other objects, features, and advantages of the invention will become more apparent when the detailed description is studied in conjunction with the drawings in which like elements are designated by like reference characters in the various drawing figures.

DETAILED DESCRIPTION OF PREFERRED EMBODIMENTS

Figure 2:
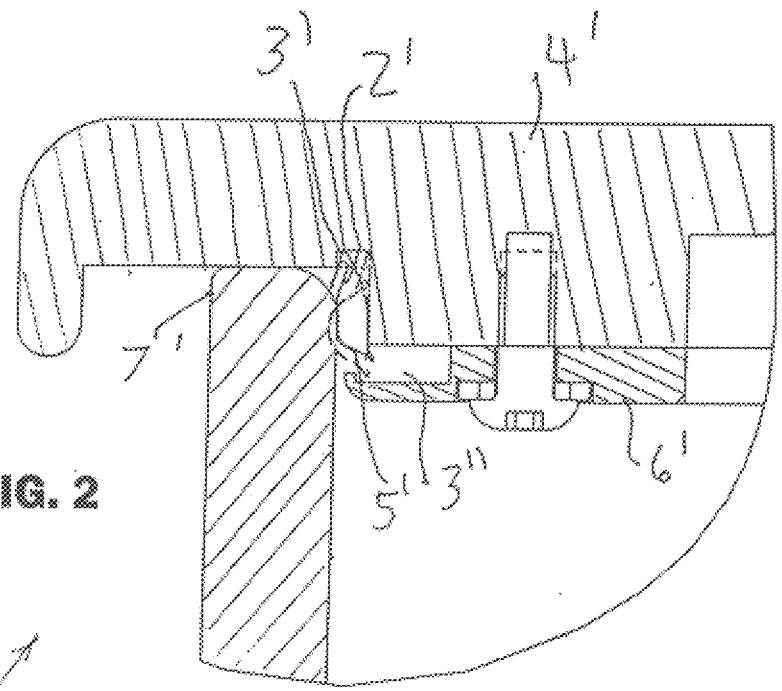
FIG. 2 is a sectional view taken through line 2—2 of FIG. 1 with cover closed.
Figure 1:
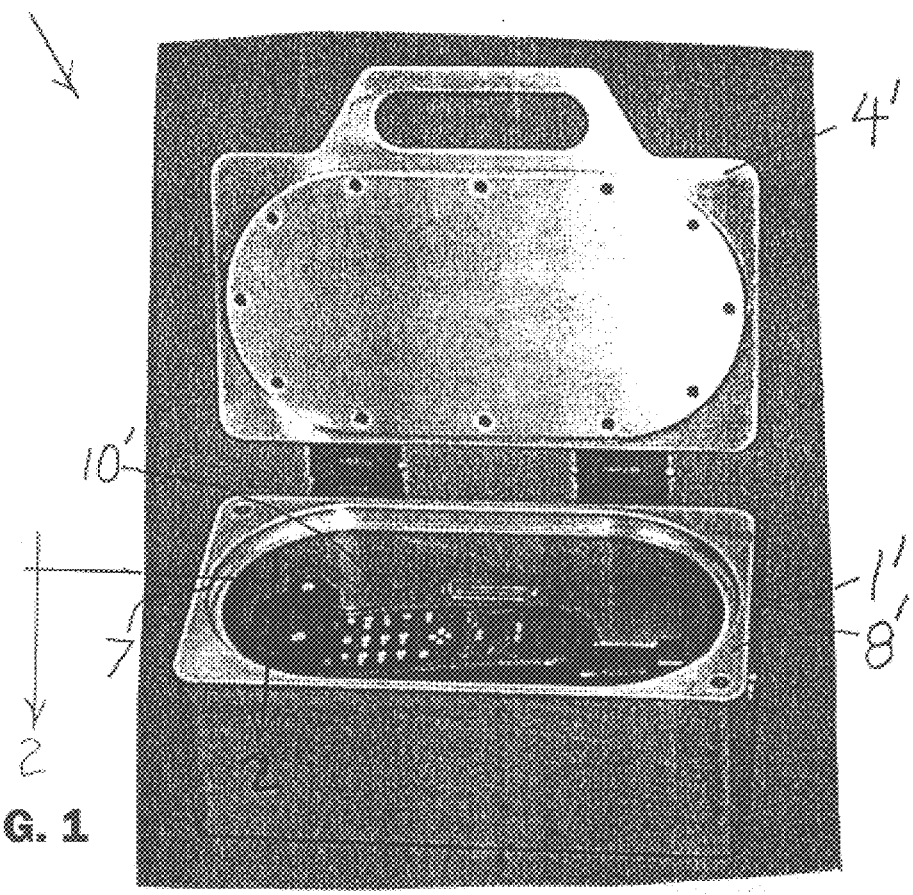
FIG. 1 is a perspective view of an enclosure of the prior art with cover open.
Figure 6:
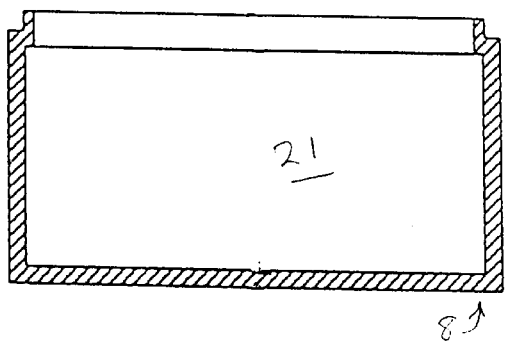
FIG. 6 is a sectional view taken through 6—6 of FIG. 5.
Figure 3:
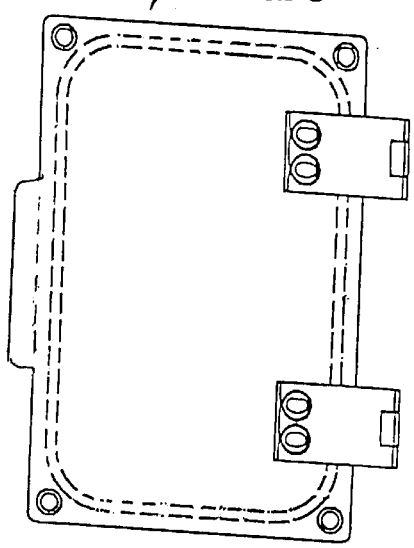
FIG. 3 is top view of the enclosure of the invention with cover closed.
Figure 8:
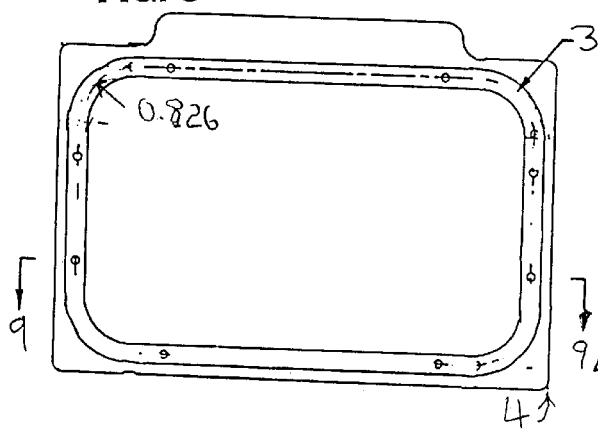
FIG. 8 is a plan view of the cover from the underside.
Figure 4:
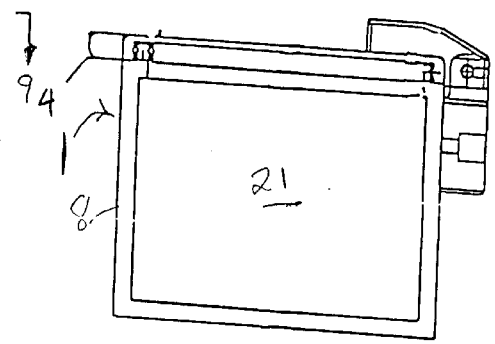
FIG. 4 is an end view of the enclosure.
Figure 9:
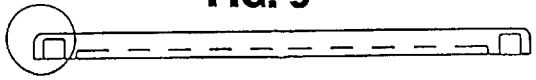
FIG. 9 is a sectional view taken through 9—9 of FIG. 8.
Figure 7:
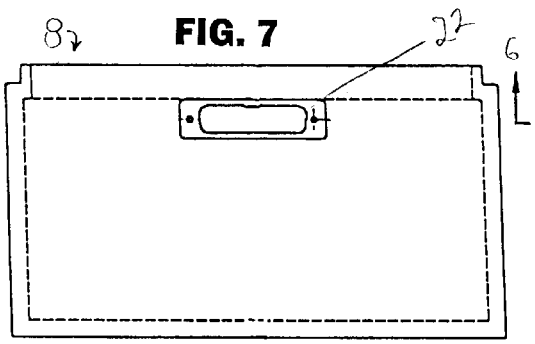
FIG. 7 is a side elevation view of the housing.
Figure 5:
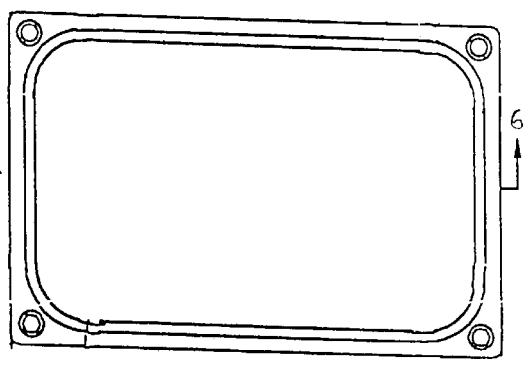
FIG. 5 is a top view of the housing with the cover removed.
Figure 10:
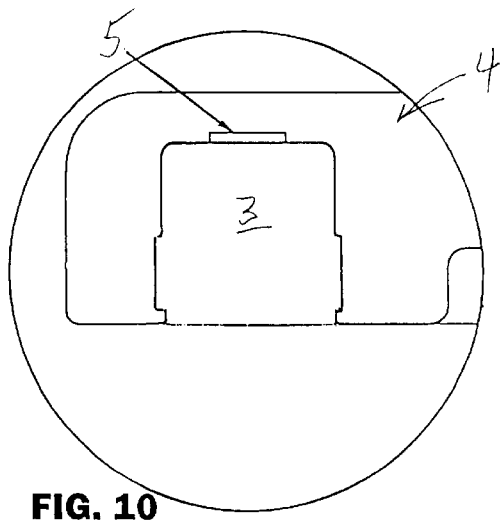
FIG. 10 is an enlarged detail of the encircled portion of FIG. 9.
Figure 12:
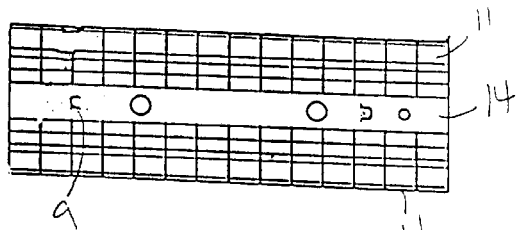
FIG. 12 is a plan view of a short straight portion of the gasket after milling and before forming to final shape.

Referring now to the drawing FIGS. 1–2, an enclosure 1' of the prior art for testing a cellular telephone 10' is shown. It features a beryllium copper shielding gasket 2' held captive between slot 3' in the cover 4' and the slot 3" in the plate 6'. The gasket 2' has springy fingers 5' which extend laterally until bent inward by the flange 7' on the housing 8' as it closes. The finger before closing is shown in phantom. The radius of the seal is limited by the radius through which the strip may be bent. This determines the dimensions and shape of the finished enclosure. A more rectangular chamber of smaller dimensions would be more useful. The spring fingers are spaced apart by 0.015 inches to permit some bending. Machining the groove 3' with precision is very difficult, and increases the cost of manufacture.

Referring now to FIGS. 3–14, an RFI shielding enclosure 1 of the invention suitable for testing and adjusting cellular telephones is shown. Housing 8 has a substantially rectangular chamber 21 with four straight sides and four corners with small radius. A cover 4 has a slot 3 with four straight sides and four corners with central radius of 0.826 inches that holds captive a beryllium copper springy sealing gasket 2 with generally U shaped spring fingers 11 extending from a continuous base 14. A bend 18 intermediate the free ends 17 of the fingers and the base closes the space between the bends to 0.1476 inches. The fingers are spaced apart from adjacent fingers by only 0.005 for enhanced shielding. The gasket is able to conform to the small radius corners by means of its special construction. It is made up of four straight sections and four corner sections. They are chemically milled out of 0.005 inch beryllium copper strip stock. They are then formed to shape and heat treated to become springy and retain their shape. Tabs 9 may be bent out to retain the sections in holes 5 in the bottom of the slot. The slot 3 is cut out to 0.286 inches wide, and then an intermediate portion of the walls are cut away to 0.3060 inches width, forming projections 10 in groove 3 that hold the gasket sections in place once they are snapped in. The fingers 11 extend outward to touch the side walls of groove 3, and the free ends 17 of the fingers prevent movement past the projections 10 in the groove. The housing 8 has an upwardly projecting flange 12 with a thickness of 0.1520 inches arranged to slide between the bends 18 of fingers 11, forcing them further apart by 0.0024 inches on each side, and pressing the fingers against the side walls of groove 3, thereby making excellent low resistance double contact for enhanced electrical shielding. The beryllium copper gasket is plated with nickel to resist formation of insulating corrosion products. The flange is provided with a rounded edge 13 to facilitate insertion and prevent damage to the gasket. The dimensions of the gasket and the flange are arranged to cause very slight deflection for easy operation and long life, yet with enough wiping and spring action to ensure low resistance contact. The strip is free to move slightly within its groove under the forces of the moving flange 12, causing a wiping contact of the free ends of the strip against the walls of the groove, as well as the wiping contact between the flange and the fingers. Shielded multi pin electrical connector 22 is mounted in an aperture in the side wall.

Figure 15:
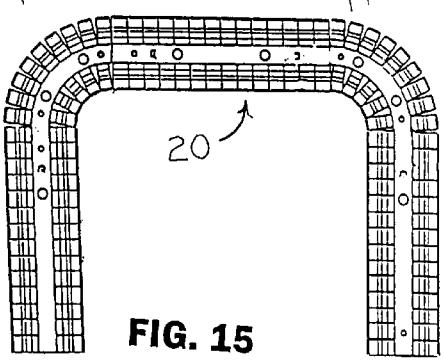
FIG. 15 is a plan view of a portion of the gasket of another embodiment of the invention after milling and before forming to final shape.
Figure 14:
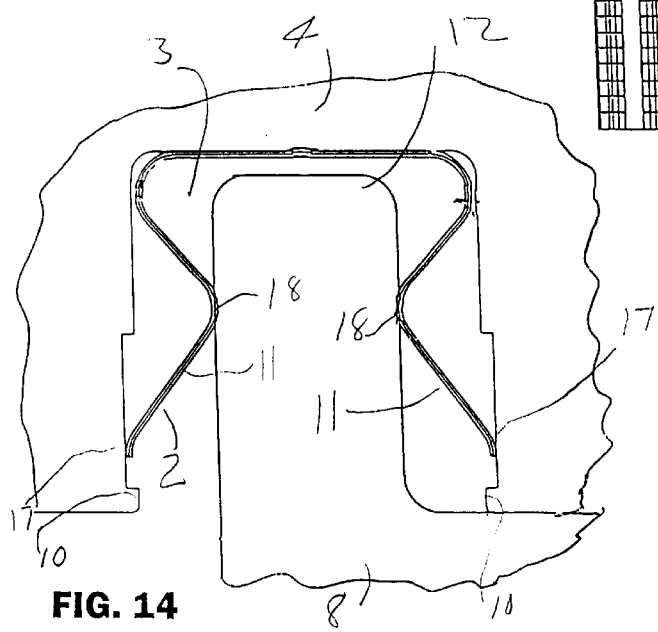
FIG. 14 is an enlarged detail as in FIG. 10 with the gasket in place and the cover closed to show the sealing mechanism.
Figure 11:
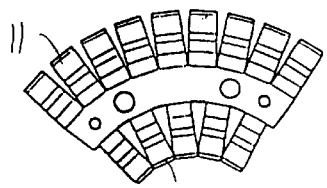
FIG. 11 is a plan view of a corner portion of the gasket after milling and before forming to final shape.
Figure 13:
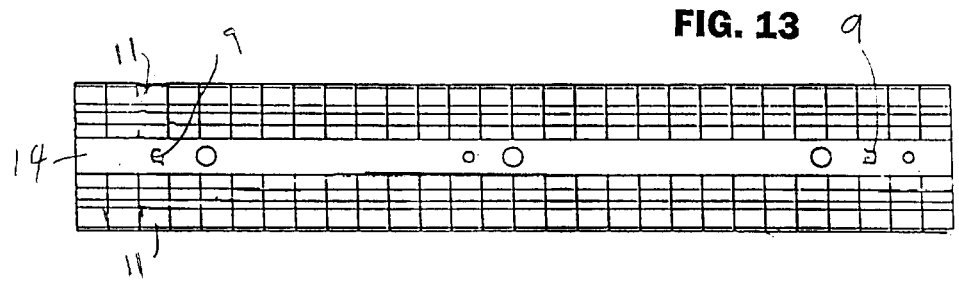
FIG. 13 is a plan view of a long straight portion of the gasket after milling and before forming to final shape.

In an alternative embodiment of the invention, as shown in FIG. 15, the two corner sections may be combined with one short section and two halves of the long sections to fabricate the sealing strip in only two separate identical pieces 20 for ease of manufacture and assembly.

In an alternative embodiment (not shown), the groove may be in the housing and the flange in the closure. The shape of the opening may vary, as desired.

The above disclosed invention has a number of particular features which should preferably be employed in combination, although each is useful separately without departure from the scope of the invention. While I have shown and described the preferred embodiments of my invention, it will be understood that the invention may be embodied otherwise than as herein specifically illustrated or described, and that certain changes in form and arrangement of parts and the specific manner of practicing the invention may be made within the underlying idea or principles of the invention.

What is claimed is:

1. A sealing strip assembly for RFI shielding of an openable closure for an opening in a housing, in which there is a groove having opposed side walls in either one of the closure or the housing and a flange in the other of the closure or the housing, the strip assembly comprising:
   a) four substantially straight portions;
   b) four corner portions, each corner portion having a radius;
   c) each portion having a continuous base with opposed long sides;
   d) a plurality of closely spaced apart fingers extending away from each of the long sides and terminating in a free end, such that the fingers on one long side oppose the fingers on the other long side;
   e) the fingers on each side having a bend at a point intermediate the free end and the base, the bend directed toward the opposing fingers, such that the space between the opposed fingers at that point is less than the space between the opposed fingers at the free ends;
   f) the free ends being arranged to elastically engage the side walls of the groove and then to wipe the side walls as the flange is inserted between the fingers; and
   g) the portions being constructed of a thin, electrically conductive material treated after forming to be springy and retain the final straight and corner forms.

2. The strip assembly according to claim 1, in which each of the portions are fabricated separately, and inserted into the groove to closely approximate one another to thereby form a substantially continuous endless shielding strip at the periphery of the closure.

3. The strip assembly according to claim 1, in which a plurality of the portions are formed together, and inserted into the groove to closely approximate one another to thereby form a substantially continuous endless shielding strip at the periphery of the closure.

4. The strip assembly according to claim 1, in which the material of construction is beryllium copper.

5. The strip assembly according to claim 4, in which the material is plated with nickel.

6. A radio frequency shielded enclosure comprising;
   a) An electrically conductive housing having a substantially rectangular shape with corners having radii, the housing enclosing a large chamber with an opening;
   b) a flange coextensive with the housing and extending away therefrom at the periphery of the opening, the flange having a first thickness;
   c) a closure openably connected to the housing configured for closing off the opening;
   d) a groove in the closure having opposed side walls and an opening for receiving therein the flange when the closure closes the opening;
   e) a sealing strip assembly comprising:
      A) four substantially straight portions;
      B) four corner portions, each corner portion having a radius;
      C) each portion having a continuous base with opposed long sides;
      D) a plurality of closely spaced apart fingers extending away from each of the long sides and terminating in a free end, such that the fingers on one long side oppose the fingers on the other long side;
      E) the fingers on each side having a bend at a point intermediate the free end and the base, the bend directed toward the opposing fingers, such that the space between the opposed fingers at that point is less than the space between the opposed fingers at the free ends, and slightly less than the first thickness of the flange; and
      F) the portions being constructed of a thin, electrically conductive material treated after forming to be springy and retain the final straight and corner forms;
   f) the strip assembly being received into the groove to thereby form a substantially continuous endless shielding strip at the periphery of the closure, and
   g) the flange arranged to pass freely between the free ends of the fingers and to force the fingers apart and against the groove walls when passing the bends, thereby creating electrical contact between the flange, the fingers and the opposed walls of the groove when the closure is closed.

7. The enclosure according to claim 6, in which the sealing strip assembly is constructed of eight individual portions that are fabricated separately and inserted into the groove in close proximity to one another.

8. The enclosure according to claim 6, in which a plurality of the portions are formed together and then inserted into the groove in close proximity to one another.

9. The enclosure according to claim 6, in which the material of construction of the sealing strip assembly is beryllium copper.

10. The enclosure according to claim 9, in which the beryllium copper is plated with nickel.

11. The enclosure according to claim 6, further comprising a projection at each of the opposed walls of the groove at the open end thereof that engage the free ends of the fingers to prevent the strip assembly from leaving the groove as the flange is removed from the strip assembly.

12. The enclosure according to claim 11, in which the free ends are arranged to elastically engage the opposed side walls of the groove and to then wipe the opposed side walls of the groove as the flange is inserted.

13. The enclosure according to claim 6, in which the free ends are arranged to elastically engage the opposed side walls of the groove and to then wipe the opposed side walls of the groove as the flange is inserted.

14. A radio frequency shielded enclosure comprising:
   a) an electrically conductive housing having a particular shape, the housing enclosing a large chamber with an opening;
   b) a closure configured for closing off the opening;
   c) a flange having a first thickness, the flange being coextensive with either one of the housing or the closure and extending away therefrom at the periphery of the opening;
   d) a groove in the other of the closure or the housing, the groove having opposed side walls and an opening for receiving therein the flange when the closure closes the opening;
   e) a sealing strip assembly comprising:
      A) a plurality of portions;
      B) each portion having a continuous base with opposed long sides;
      C) a plurality of closely spaced apart fingers extending away from each of the long sides and terminating in a free end, such that the fingers on one long side oppose the fingers on the other long side;
      D) the fingers on each side having a bend at a point intermediate the free end and the base, the bend directed toward the opposing fingers, such that the space between the opposed fingers at that point is less than the space between the opposed fingers at the free ends, and slightly less than the first thickness of the flange; and
      E) the portions being constructed of a thin, electrically conductive material treated after forming to be springy and retain the final forms required to form a substantially continuous shielding strip at the periphery of the opening;
   f) the strip assembly being received into the groove to thereby form a substantially continuous endless shielding strip at the periphery of the closure, and
   h) the flange arranged to pass freely between the free ends of the fingers and to force the fingers apart and against the groove walls when passing the bends, thereby creating electrical contact between the flange, the fingers and the opposed walls of the groove when the closure is closed.

15. The enclosure according to claim 14, in which the free ends are arranged to elastically engage the opposed side walls of the groove and to then wipe the opposed side walls of the groove as the flange is inserted.

16. The enclosure according to claim 15, further comprising a projection at each of the opposed walls of the groove at the open end thereof that engage the free ends of the fingers to prevent the strip assembly from leaving the groove as the flange is removed from the strip assembly.

17. A sealing strip assembly for an RFI shielded enclosure, the enclosure having:
   an electrically conductive housing, the housing enclosing a large chamber with an opening;
   a closure configured for closing off the opening;
   a flange having a first thickness, the flange being coextensive with either one of the housing or the closure and extending away therefrom at the periphery of the opening; and
   a groove in the other of the closure or the housing, the groove having opposed side walls and an opening for receiving therein the flange when the closure closes the opening;
   the sealing strip assembly comprising:
      A) a plurality of portions;
      B) each portion having a continuous base with opposed long sides;
      C) a plurality of closely spaced apart fingers extending away from each of the long sides and terminating in a free end, such that the fingers on one long side oppose the fingers on the other long side;
      D) the fingers on each side having a bend at a point intermediate the free end and the base, the bend directed toward the opposing fingers, such that the space between the opposed fingers at that point is less than the space between the opposed fingers at the free ends, and slightly less than the first thickness of the flange;
      E) the free ends being constructed to elastically engage the opposed side walls of the groove when inserted therein, and to then wipe the opposed walls of the groove as the flange is inserted for enhanced electrical contact; and
      F) the portions being constructed of a thin, electrically conductive material treated after forming to be springy and retain the final forms required to form a substantially continuous shielding strip at the periphery of the opening.

* * * * *